United States Patent [19]

Iketani

[11] Patent Number: 4,975,623
[45] Date of Patent: Dec. 4, 1990

[54] ELECTROMAGNETIC RELAY FOR TRANSMITTING OPERATING SOUNDS THEREOF

[75] Inventor: Hiroshi Iketani, Nagano, Japan

[73] Assignee: Omron Tateisi Electronics Co., Kyoto, Japan

[21] Appl. No.: 195,449

[22] Filed: May 16, 1988

Related U.S. Application Data

[63] Continuation of Ser. No. 899,827, Aug. 25, 1986, abandoned.

[30] Foreign Application Priority Data

| Sep. 10, 1985 | [JP] | Japan | 60-138621[U] |
| Nov. 15, 1985 | [JP] | Japan | 60-176691[U] |
| Dec. 11, 1985 | [JP] | Japan | 60-190666[U] |
| Feb. 25, 1986 | [JP] | Japan | 61-27130[U] |

[51] Int. Cl.⁵ ................................................ B60Q 1/26
[52] U.S. Cl. ........................................ 315/77; 335/202; 335/203; 335/199; 340/474; 340/475; 181/192
[58] Field of Search ............ 335/202, 203, 199, 197, 335/175, 157; 340/474, 475, 480, 482, 487; 181/177, 192, 179; 315/77

[56] References Cited

U.S. PATENT DOCUMENTS

| 1,046,454 | 12/1912 | Fischer | 181/192 |
| 2,393,784 | 1/1946 | Leavitt | 335/197 |
| 2,539,547 | 1/1951 | Mossman et al. | 335/157 |
| 3,194,917 | 7/1965 | Moore | 335/197 |
| 3,273,093 | 9/1966 | Hayden | 335/203 |
| 3,308,407 | 3/1967 | Lake | 335/203 |
| 3,315,226 | 4/1967 | Fernekes | 340/474 |
| 4,101,855 | 7/1978 | Drapeau | 335/202 |
| 4,254,392 | 3/1981 | Prohaska et al. | 335/202 |
| 4,400,761 | 8/1983 | Hayden et al. | 335/199 |

FOREIGN PATENT DOCUMENTS

| 0111939 | 6/1984 | European Pat. Off. . |
| 2413780 | 8/1975 | Fed. Rep. of Germany . |
| 2647439 | 4/1978 | Fed. Rep. of Germany . |
| 7816671 | 11/1979 | Fed. Rep. of Germany . |
| 1094247 | 12/1967 | United Kingdom ........ 335/202 |

Primary Examiner—Eugene R. LaRoche
Assistant Examiner—Michael Shingleton
Attorney, Agent, or Firm—Wegner, Cantor, Mueller & Player

[57] ABSTRACT

An electromagnetic relay according to the present invention is applicable, for example, to a flasher relay to be mounted in automobiles, autobicycles or the like. When a driver of the automobile turns on the switch for the winker, the winker lamp is turned on and off and at the same time, a sound is generated to inform the driver of the fact that the winker lamp is being operated.

2 Claims, 4 Drawing Sheets

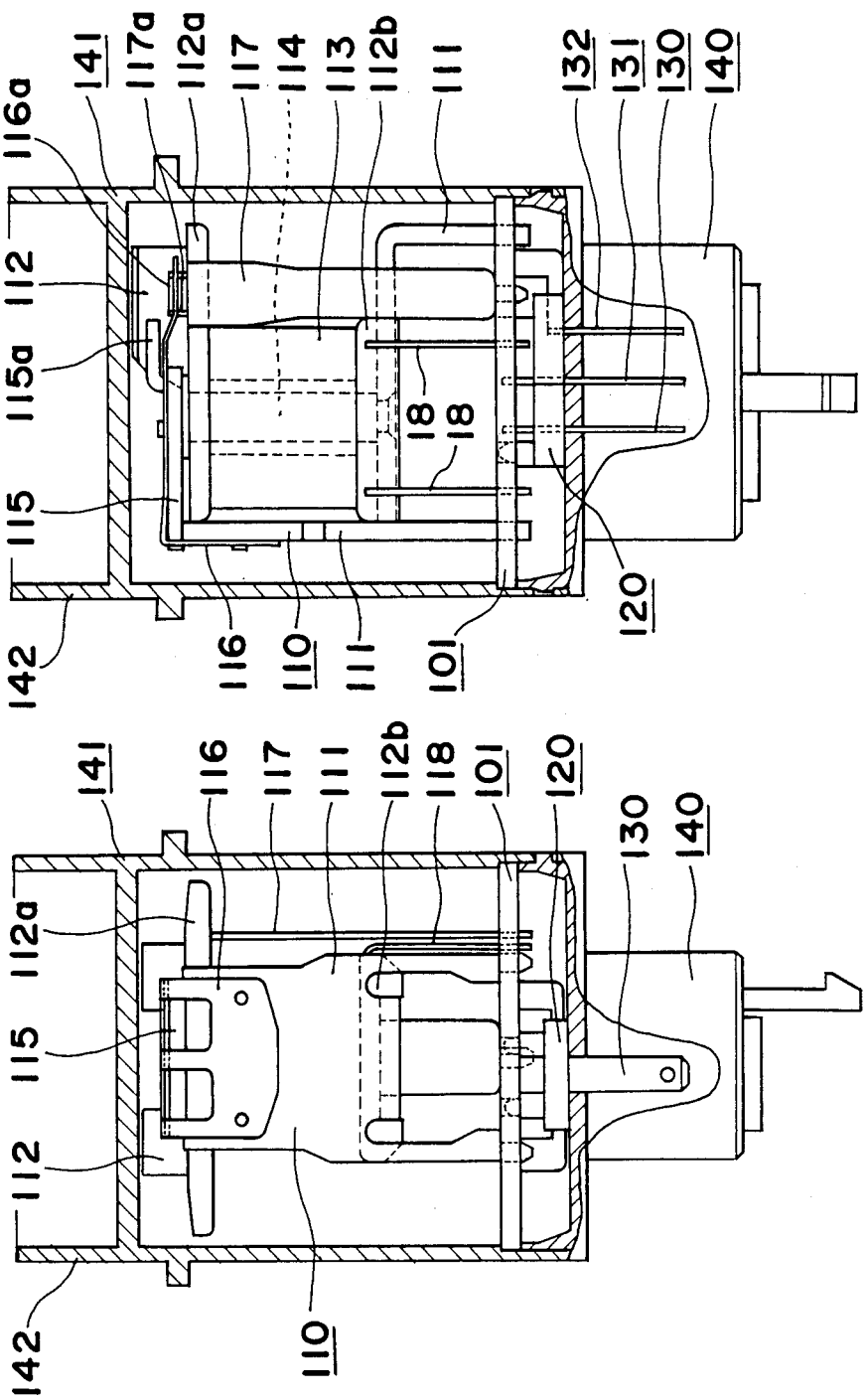

ELECTROMAGNETIC RELAY FOR TRANSMITTING OPERATING SOUNDS THEREOF

This application is a continuation of U.S. application Ser. No. 899,827, filed Aug. 25, 1986, now abandoned.

BACKGROUND OF THE INVENTION

The present invention relates to an electromagnetic relay which is suitable for use in a winker of a motor vehicle.

Generally, an electromagnetic relay is employed in the winker of the motor vehicle in order to intermittently supply electricity into a winker lamp. In this case, it is necessary that the fact that the winker lamp is working should be confirmed from outside, that is, should be recognized as an operating sound to be heard well by a driver of the motor vehicle.

For the above purpose, therefore, such an arrangement has conventionally been designed that when a movable component, i.e., a movable iron piece of the electromagnetic relay is returned to its original position, a part of the movable iron piece collides against the wall of a casing of the relay, which makes a sound to be heard outside as the operating sound.

In the above-described construction, however, the sound generated when the movable iron piece collides against the wall of the casing is generally dispersed and heard small. Therefore, it is inconvenient for the driver to find difficulties in hearing the sound.

In the prior art electromagnetic relay of the type referred to above, the movable iron piece is rotatably supported by an electromagnetic block via a hinged spring. When the electromagnetic block is excited to adhere an iron core by electromagnetic attraction, a movable contact point of a movable contact piece fixed to the movable iron piece is brought into contact with a fixed contact. On the contrary, when the excitation of the electromagnetic block is released, the movable iron piece hits the inner wall of the casing.

In other words, the inner wall of the casing in the prior art electromagnetic relay acts as a sounding means, and at the same time, it acts as a stopper for the movable iron piece.

On the other hand, the operating voltage of the electromagnetic relay has been adjusted by the adjustment of spring force which depends on how much the hinged spring is bent under the condition that the movable iron piece is in contact with the stopper.

However, since the stopper for the iron piece acts also as the sounding means as described above, if the operating voltage is adjusted incompletely, with the casing being sealed, it is necessary to open the casing again and to readjust the spring force of the hinged spring. Accordingly, it takes considerably difficult and painstaking work to adjust the operating voltage. Moreover, if the spring force of the hinged spring is increased so as to make a higher tone of the stopper as is often the case, the operating voltage is inclined to be raised.

Additionally, for the electromagnetic relay to be mounted on the motor vehicle, it is required to be highly resistive against shocks and vibrations. It is needless to say, therefore, that the electromagnetic relay should have solid and sturdy construction. In the prior art relay, however, terminals such as a contact terminal or a coil terminal secured to a coil spool and a common terminal secured to the yoke are fixed to the base in the manner that they are pressed into the base, and accordingly, the whole body of the electromagnetic body is maintained onto the base only by these thin plate-like terminals. Therefore, the relay cannot be held onto the base with sufficient strength, particularly, the heaviest electromagnetic block of the relay cannot be stably maintained, resulting in such problem that the features of the electromagnetic relay are unfavorably changed by shocks and/or vibrations.

For an electric device in which a leading terminal electrically connected to electric components is formed on a substrate mounting the electric components, for example, a terminal of the component is protrudingly inserted from above into a mounting hole (not shown) in the substrate printed with circuit. On the other hand, the upper end of the leading terminal which is cut out from the terminal to be bent is inserted from below into the positioning hole of the substrate. At the same time, the electric component and the leading terminal are electrically connected to each other by soldering via the printed circuit board.

However, when some external force is added to the leading terminal from outside in the electric device described above, the force affects also the mounting substrate to which is directly fixed the terminal, resulting in an easy damage of the substrate or an easy peeling-off of the solderings.

What is worse, the leading terminal is inserted into the hole of the thin substrate for fixing, consequently giving rise to such drawback that the leading terminal is apt to be displaced, the positioning accuracy of which is therefore quite low.

SUMMARY OF THE INVENTION

Accordingly, an essential object of the present invention is to provide an improved electromagnetic relay which is arranged to transmit outside the operating sound thereof in a relatively large volume, with substantial elimination of the above-described disadvantages or inconveniences inherent in the prior art relays.

A second object of the present invention is to provide an electromagnetic relay of the type referred to above, wherein the voltage in operating the relay can be adjusted easily and accurately and which can achieve a louder tone of the operating sound.

A third object of the present invention is to provide an electromagnetic relay of the type referred to above wherein an electromagnetic block is secured to the base with sufficient strength through arrangement of the configuration of the yoke, and which is therefore highly resistive against shocks or vibrations.

A fourth object of the present invention is to provide an electromagnetic relay of the type referred to above which can more securely hold the leading terminals and improve the positioning accuracy of the terminals, when employed in an electric device having leading terminals which are electrically connected to an electric component mounted on a substrate, by holding the base portion of the leading terminals by the use of a terminal guide block fixed to the substrate.

In accomplishing the above-described objects, according to the present invention, it is so arranged in the electromagnetic relay that the contact sound between contact points or the sound generated when a movable part of the relay collides against a fixed member at the original position is transmitted via the wall of a casing to be heard outside as the operating sound of the relay. The electromagnetic relay is provided with a cylindrical megaphone at the outer surface of the casing in such a manner as to surround the wall of the casing. Accordingly, the collision sound of the movable part at the original position or the contact sound between contacts can be heard outside as the operating sound of the relay. Moreover, owing to the presence of the cylindrical megaphone, the collision sound or the contact sound can be concentrated to one direction to be transmitted outside in a large volume.

According to the electromagnetic relay of the present invention, there is provided a first stopper opposite to a movable contact piece so that the movable contact piece is brought into contact with the first stopper when the electromagnetic block is de-magnetized, with the casing being opened. At the same time, a second stopper is provided in such a manner as to protrude out of the inner wall of the casing so that the movable contact piece is held at the intermediate position between the first stopper and the fixed contact when the electromagnetic block is demagnetized, with the casing being sealed. Thus, the operating voltage of the electromagnetic relay of the present invention can be adjusted easily and accurately while the casing is opened, and the movable contact piece is in contact with the first stopper. Furthermore, since the movable contact piece is retained by the second stopper at the intermediate position between the first stopper and the fixed contact while the casing is sealed, not only is the movable contact piece able to hit the second stopper directly without being affected by the first stopper, but the operating voltage of the relay never exceeds the value adjusted outside the casing.

The electromagnetic relay according to the present invention further includes a yoke constituting the electromagnetic block which is provided with three leg portions extending below in a direction perpendicular to the base. Each of the leg portions is mounted on the base in the manner to describe a triangular shape. Accordingly, the yoke is supported at three points, and the electromagnetic block is stably fixed onto the base with sufficient strength. As a result, even some shocks or vibrations given to the electromagnetic relay never rattle the electromagnetic block, thereby to realize the electromagnetic relay of highly stable characteristics without any change in the distance between contacts.

Moreover, in a modified embodiment of the electromagnetic relay of the present invention, the base portion of a leading terminal electrically connected to the electric component is retained by a terminal guide block secured to the mounting substrate. Thus, the leading terminal is mechanically connected to the mounting substrate through the terminal guide block. Therefore, even if the leading terminal is imposed with some external force, the terminal guide block absorbs the external force, preventing the mounting substrate from damage or peeling off of the solderings. Further, since the leading terminal is securely supported on the base by the terminal guide block, the leading terminal is position-restricted by the terminal guide block, with improved positioning accuracy.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals and, in which:

FIG. 8 is a rear sectional view of an electromagnetic relay according to the fourth embodiment of the present invention;

FIG. 9 is a side sectional view of the electromagnetic relay of FIG. 8;

DETAILED DESCRIPTION OF THE EMBODIMENTS

Figure 1:
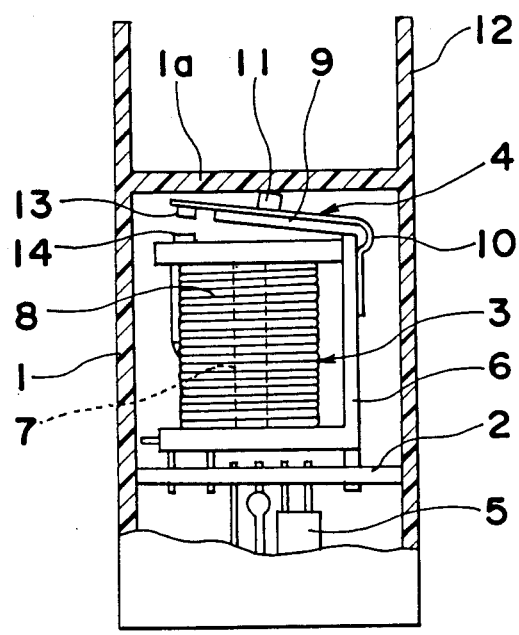
FIG. 1 is a front elevational view of an electromagnetic relay, with a part being taken off, according to the first embodiment of the present invention.

Referring first to FIG. 1, there is shown a front elevational view of an electromagnetic relay according to the first embodiment of the present invention. In a casing 1 of the electromagnetic relay, made of synthetic resin, there are included a circuit board 2, an electromagnet 3 fixed to the circuit board 2 and a movable member 4 driven by the electromagnet 3, and so on. An element 5 is mounted on the circuit board 2 for constituting an oscillation circuit.

The above electromagnet 3 is comprised of a yoke 6, an iron core 7 secured to the yoke 6, an electromagnetic coil 8 which is electrically insulatively wound around the iron core 7, etc. The movable member 4 includes a movable iron piece 9 slidably supported at the upper end of the yoke 6, and a returning spring 10 which works as a hinge for the movable iron piece 9. The movable member 4 has a protrusion 11 formed on the upper surface thereof, which protrusion is to collide against the inner surface of an upper wall 1a of the casing 1. Further, a cylindrical megaphone 12 is integrally formed with the upper wall 1a of the casing in such a manner as to surround the portion of the upper wall 1a collided by the protrusion 11. There are contact points 13 and 14.

When the electromagnetic relay having the above-described construction is installed in a winker device for a motor vehicle, the supply of power to the electromagnetic coil 8 is intermittently carried out by the oscillation of the oscillating circuit through manipulation of a winker by a driver, so that the movable iron piece 9 is repeatedly attracted and separated to and from the upper end of the iron core 7. In consequence to this, the winker (not shown) is turned on and off, and at the same time, the protrusion 11 collides against the inner surface of the upper wall 1a while the movable part 4 is returned to its original position, making a sound. Accordingly, the driver can acknowledge the fact that the winker is being operated by the sound of collision of the protrusion 11. Particularly, since the megaphone 12 integrally formed with the casing 1 can concentrate the collision sound in one direction, the sound is easier to be heard by the driver as the operating sound of the winker.

Figure 2:
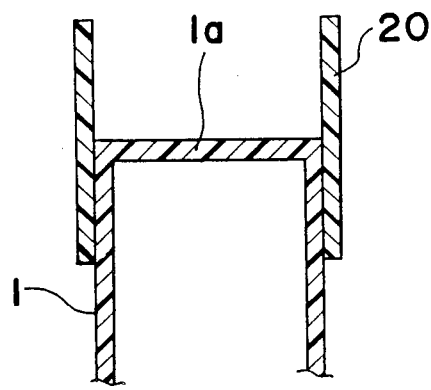
FIGS. 2 and 3 are respectively a cross sectional view of an essential part of the electromagnetic relay in a modified embodiment of FIG. 1.
Figure 3:
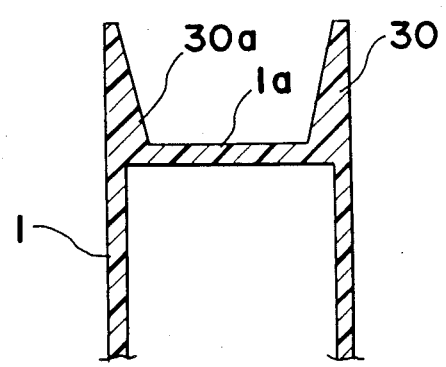

Although the megaphone 12 is easy to be manufactured if it is integrally formed with the casing 1 as in the foregoing embodiment, it may be formed into a separate megaphone 20 to be provided with the casing 1 as shown in FIG. 2. In this case, it may be possible that the length of the megaphone 20 protruding out of the upper wall 1a is made adjustable. Moreover, as shown in FIG. 3, if the inner surface 30a of the megaphone 30 is gradually spreading towards its end, the collision sound can be heard louder. It is needless to say that the megaphone 30 in its entirety, not only its inner surface, may be spreading out towards the tip end.

Further, it is to be noted here that although the protrusion 11 of the movable member 4 is arranged to collide directly against the inner surface of the upper wall 1a in the foregoing embodiment it may be so arranged that the movable member 4 collides against the inner surface of the upper wall via some other fixed member.

Moreover, the same effect as when the collision sound works to inform the driver of the operation of the winker can be achieved also when the contact sound between the contacts 13 and 14 is transmitted to the inner surface of the upper wall 1a and amplified by the megaphone.

Figure 4:
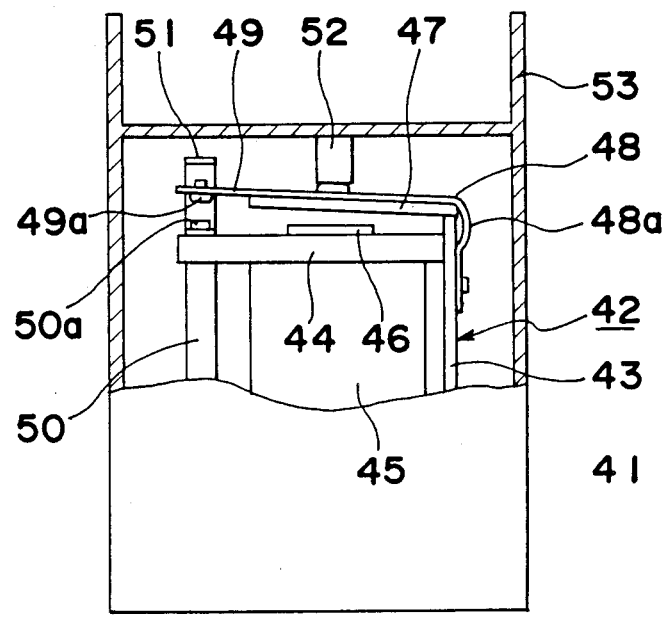
FIG. 4 is a side elevational view of an electromagnetic relay, with a part being taken off, according to the second embodiment of the present invention.

Referring to FIG. 4, there is shown a side elevational view of an electromagnetic relay, with a portion being taken off, according to the second embodiment of the present invention. In FIG. 4, an electromagnetic block 42 accommodated in a casing 41 is comprised of a yoke 43, an electromagnetic coil 45 wound around by a spool 44 and an iron core 46 inserted through the spool 44. A movable iron piece 47 is rotatably supported at one end of the yoke 42 by a hinged spring 48 which urges spring force to the iron piece 47 in the direction the iron piece 47 is separated away from the iron core 46. A movable contact piece 49 integral with the hinged spring 48 has a contact 49a detachably provided opposite to a fixed contact 50a of an external terminal 50.

A first stopper 51 is provided opposite to the movable contact 49a. The first stopper 51 is arranged to be brought into contact with the movable contact piece 49 when the electromagnetic block 42 is de-magnetized, with the casing 41 being opened.

On the other hand, a second stopper 52 is provided opposite to the movable iron piece 47. As shown in FIG. 4, when the electromagnetic block 42 is de-magnetized, with the casing 41 being in a sealed condition, the second stopper 52 is brought into direct contact with the movable iron piece 47 and, the movable contact piece 49 is held at the intermediate position between the first stopper 51 and the fixed contact 50a.

A megaphone 53 is integrally formed with the casing 41 and protrudes from the casing.

In the above-described construction, when the electromagnetic coil 45 is excited, the movable iron piece 47 is attracted to the iron core 46, and the contact 49a of the movable contact piece 49 comes into contact with the fixed contact 50a. When the excitation of the electromagnetic coil 45 is released, the movable iron piece 47 is returned by the spring force of the hinged spring 48.

As is described earlier, since the second stopper 52 protrudingly provided on the inner wall of the casing 41 holds the movable contact piece 49 at the intermediate position between the first stopper 51 and the fixed contact 50a while the casing 41 is in the sealed condition, the movable iron piece 47 is able to directly hit the second stopper 52, without being interrupted by the first stopper 51, thereby making a high tone of the sound.

On the contrary, when the casing 41 is opened, the movable contact piece 49 can be brought into contact with the fist stopper 51. Therefore, if a bent portion 48a of the hinged spring 48 is adjusted as to the degrees of the bending in the condition that the movable contact piece 49 is in contact with the first stopper 51, the operational voltage of the electromagnetic relay can be adjusted.

What is more convenient is that the operational voltage can be adjusted in the state where the casing 41 is opened, and therefore, the adjustment of the voltage can be carried out considerably easily and accurately. Furthermore, since the movable iron piece 47 is pressed by the second stopper 52 to be adjacent to the iron core 46 when the casing 41 is sealed, it is favorable that the operational voltage never exceeds the voltage adjusted outside the casing 41.

Although the movable contact piece 49 is integrally formed with the hinged spring 48 in the second embodiment, it is needless to say that these may be separately formed from each other and provided with the movable iron piece 47 via an electrically-insulative body.

Figure 5:
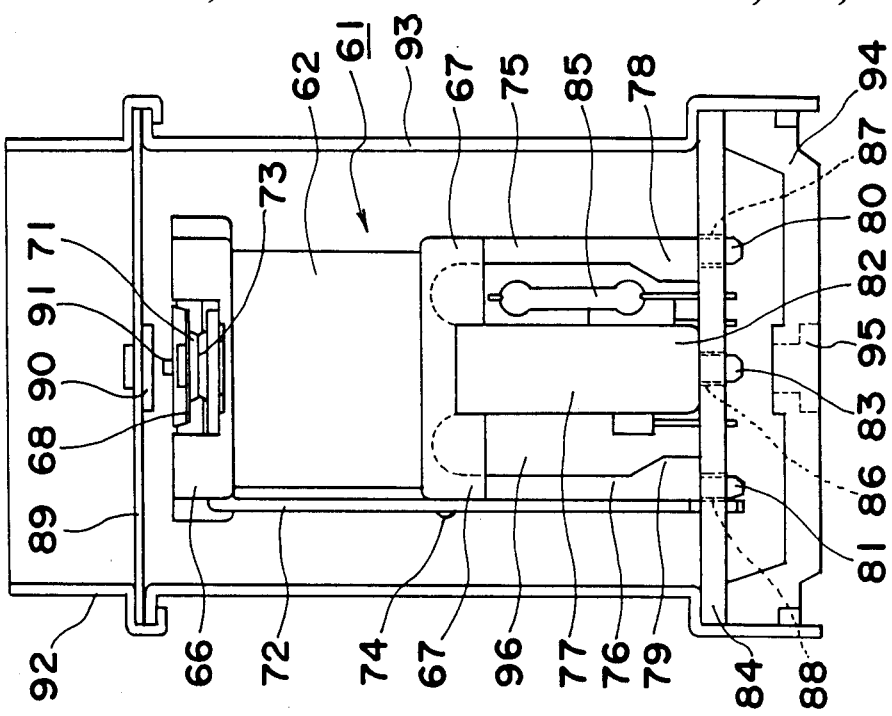
FIG. 5 is a front sectional view of an electromagnetic relay according to the third embodiment of the present invention.
Figure 6:
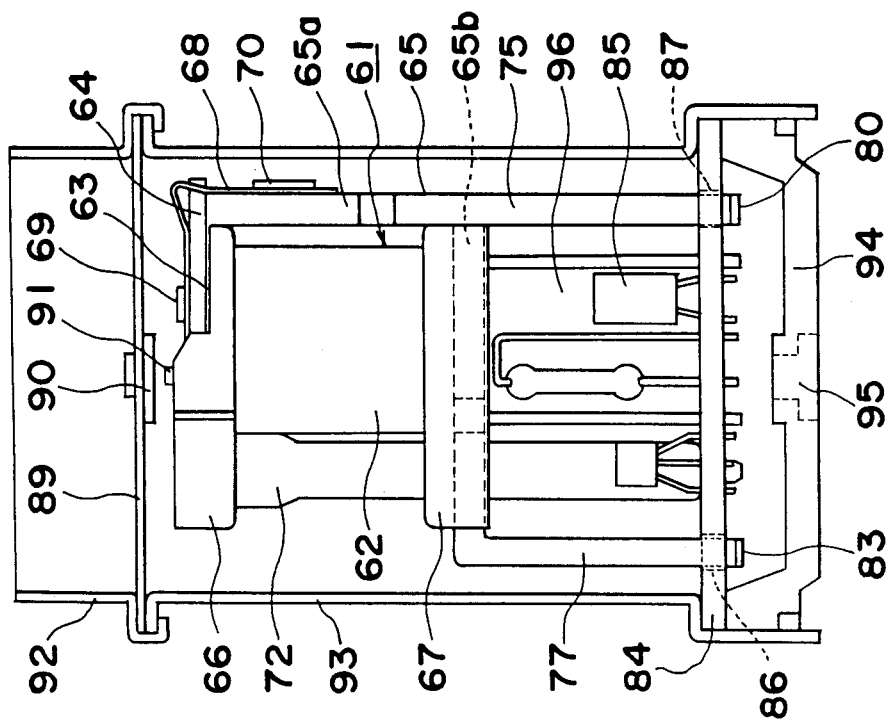
FIG. 6 is a left side sectional view of the electromagnetic relay of FIG. 5.
Figure 7:
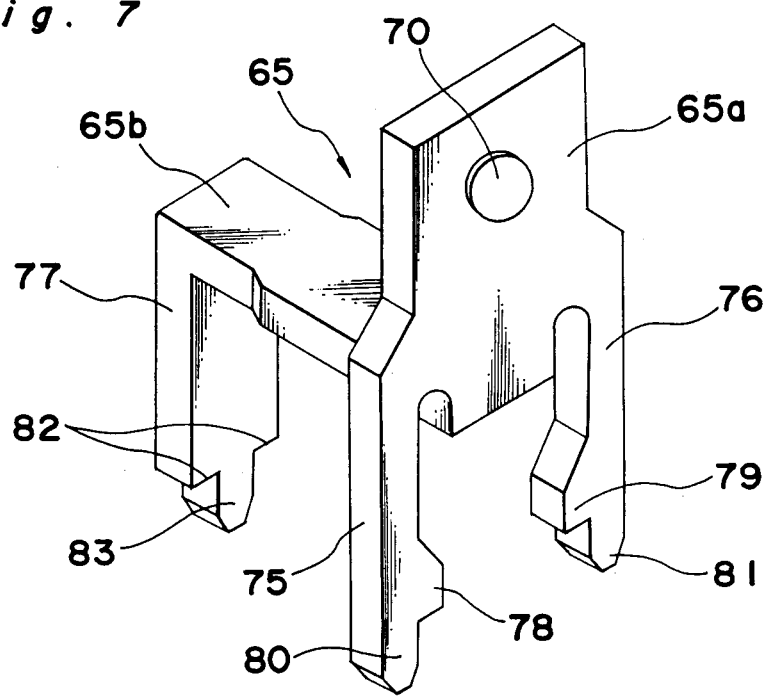
FIG. 7 is a perspective view of a yoke of the electromagnetic relay of FIG. 5.

Now, referring to FIGS. 5 to 7, an electromagnetic relay shown therein in accordance with the third embodiment of the present invention includes an electromagnetic block 61, a coil 62, an iron core 63 inserted through the coil 62, a movable iron piece 64 to be attracted to the iron core 63, and a yoke 65 which, together with the iron core 63 and the movable iron piece 64, constitutes a magnetic circuit. The coil 62 is wound around armors 66 and 67 of the spool. The movable iron piece 64 is fixedly provided with a movable contact piece 68 by a rivet 69, one end portion of which is bent downwardly and caulked to a vertically-positioned piece 65a by a protrusion 70. Thus, the movable iron piece 64 is rotatably hinged to the upper end of the vertically-positioned piece 65a by the movable contact piece 68.

At the other end portion of the movable contact piece 68, a movable contact 71 is fixedly provided as shown in FIG. 6. On the other hand, an upper portion of a fixed contact terminal 72 is bent to be secured to the armor 66. The bent portion of the terminal 72 is fixedly provided with a fixed contact 73, and at the same time, the central part of the fixed contact terminal 72 is secured to a protrusion 74 formed at the armor 67 by heat-caulking. Further, the lower end portion of the fixed terminal 72 is inserted into a hole (not shown) of a printed circuit board 84 which will be described later to be fixed to the reverse surface of the substrate 84 by soldering.

The yoke 65 formed into a chair-like configuration as shown in FIG. 7 is provided with the vertically-standing piece 65a and a horizontally-positioned piece 65b which is successive to the vertically-standing piece 65a. A pair of leg portions 75 and 76 extend downwards from opposite lower portions of the vertically-standing piece 65a in the direction perpendicular to the printed circuit board 84. In addition, one end portion of the horizontally-positioned piece 65b is also bent with right angles in the same direction as the vertically-standing piece 65a so as to form a leg portion 77. The leg portions 75 and 76 have engagement portions 78 and 79, respectively, with injection portions 80 and 81 formed at the respective tip ends. The leg portion 77 is provided with an engagement portion 82 which has an injection portion 83 formed at the tip end thereof.

Electronic components 85 constituting an oscillation circuit are mounted on the upper surface of the printed circuit board 84. In the printed circuit board 84 are formed three openings 86, 87 and 88 into which the injection portions 83, 80 and 81 are respectively inserted so that the engagement portions 82, 78 and 79 are engaged to the upper surface of the substrate 84. These injection portions 80, 81 and 83 of the yoke 65 are fixed to the rear surface of the printed circuit board 84 by soldering in accordance with the printed pattern.

In the manner as described hereinabove, the electromagnetic relay of the present embodiment has the construction that the electromagnetic block 61 is secured onto the printed circuit board 84, and the electronic components 85 are placed in the space 96 below the electromagnetic block 61 formed by the three leg portions 75, 76 and 77.

A metal rivet 90 is secured to the center of an upper lid 89 made of a metallic thin plate. Opposite to this rivet 90 is formed a protrusion 91 integral with the movable iron piece 64. The upper lid 89 is secured to a casing 93 by a tightening drum 92, the protruding portion of which shapes a megaphone. Accordingly, the upper lid 89 seals an upper opening of the casing 93, while the lower opening of the casing 93 is sealed by a lower lid 94 made of an insulative material. The printed circuit board 84 is installed in the lower part of the casing 93. A reference numeral 95 represents a mounting hole formed in the lower lid 84 for mounting the electromagnetic relay therethrough.

The electromagnetic relay of the above construction is employed, for example, for controlling the supply of electricity into a winker of an automobile, which is so arranged as to apply outputs generated by the oscillation circuit constituted by the electronic components 85 to the coil 62. Therefore, the coil 62 is repeatedly excited and de-magnetized by the outputs from the oscillation circuit, which in turn brings the movable iron piece 64 to be repeatedly attracted to or separated from the iron core 63. In consequence to this, the movable contact 71 at the tip end of the movable contact piece 68 is repeatedly attracted to or detached from the fixed contact 73, intermitting the supply of power to the winker lamp and, turning on and off the winker lamp. In this case, the protrusion 91 provided with the movable iron piece 64 is brought into contact with the rivet 90 when the movable iron piece 64 is being returned to the original position, and accordingly, the upper lid 89 is vibrated to make sound. Therefore, the driver of the automobile can be informed of the fact that the winker lamp is being operated.

As is clear from FIG. 7, according to the third embodiment of the present invention, the yoke 65 is supported on the printed circuit board 84 at three points, that is, the injection portions 80, 81 and 83. Moreover, these supporting portions 80, 81 and 83 form a triangular shape. Therefore, the yoke 65 is fixedly mounted onto the printed circuit board 84 by a so-called three-point supporting. Thus, the electromagnetic block 61 is supported with remarkable stability by the firm yoke 65 unlike the prior art thin terminal member. The electromagnetic block 61 can be secured onto the printed circuit board 84 with solidity and substantiality. Moreover, since the fixed terminal 72 is added with no burden, there are no possibilities at all that the fixed terminal 72 is deformed to change the characteristics. It is therefore possible to maintain stable characteristics of the contacts.

It is to be noted here that although the iron core 63 an the yoke 65 are formed separately from each other in the third embodiment, the present invention is applicable also to an electromagnetic relay wherein the iron core 63 is integral with the yoke 65.

Furthermore, although the leg portions 75, 76 and 77 of the yoke 65 are secured to the printed circuit board 84 by soldering in the third embodiment, the yoke 65 may be secured to the substrate 84, for example, by caulking or by pressure-insertion, etc.

An electromagnetic relay of the fourth embodiment of the present invention will be described with reference to FIGS. 8 to 11.

In the fourth embodiment, the relay is applied to a winker relay to be mounted on a motor vehicle. The winker relay is schematically comprised of a mounting substrate 101, a relay 110, a terminal guide block 120, leading terminals 130, 131 and 132, a base covering 140 and a head covering 141.

The mounting substrate 101 is of a disk shape and is arranged with printed circuit on the lower surface thereof. The substrate 101 has a plurality of holes through which the relay 110, the terminal guide block 120 and leading terminals 130, 131 and 132 are inserted for fixing.

The relay 110 is composed of a yoke 111, a spool 112, a movable iron piece 1-15, a movable contact piece 116, a contact point terminal 117 and coil terminals 118.

The yoke 111 is obtained by cutting out and bending, the lower end portion of which is pressed into the mounting hole of the substrate 101 from above to protrude from the substrate 101.

The spool 112 has armors 112a and 112b formed at the upper and lower end portions thereof, and a coil 113 wound around the trunk thereof. Moreover, the spool 112 is caulked to the upper surface of the horizontal portion of the yoke 111 via an iron core 114 inserted through the central hole thereof.

The movable iron piece 115 is rotatably hinged to the upper end portion of the yoke 111 through the movable contact piece 116, so that the lower surface of the iron piece 115 is able to be in contact with the upper end face of the iron core 114 and at the same time, one end portion 115a is able to be in contact with the reverse surface of the ceiling of the head covering 141. A megaphone 142 protrudes above the covering 141.

The movable contact piece 116 is made of an electrically-conductive spring plate bent into an approximately L-shape. The movable contact piece 116 has its vertical portion secured to the outer side face of the vertical portion of the yoke 111 by caulking, and at the same time, the movable contact piece 116 has a movable contact point 116a provided at one free end thereof.

In the meantime, the contact terminal 117 is made of an electrically-conductive plate material into an approximately L-shape. The lower end portion of the contact terminal 117 is protrudingly pressed into the mounting hole formed in the mounting substrate 101, while at the other end portion of the contact terminal 117, the horizontal portion having a fixed contact 117a is positioned at the upper surface of the armor 112a. The fixed contact 117b is selectively detachable from the movable contact 116a.

The coil terminals 118 are electrically connected to the coil 113, with their lower end portions being protrudingly pressed into the mounting substrate 101.

Each of the yoke 111 and lower ends of the contact terminal 117 and the coil terminals 118 protruding out of the lower surface of the mounting substrate 101 is mechanically and electrically connected to the printed circuit board (not shown) by soldering.

Figure 11:
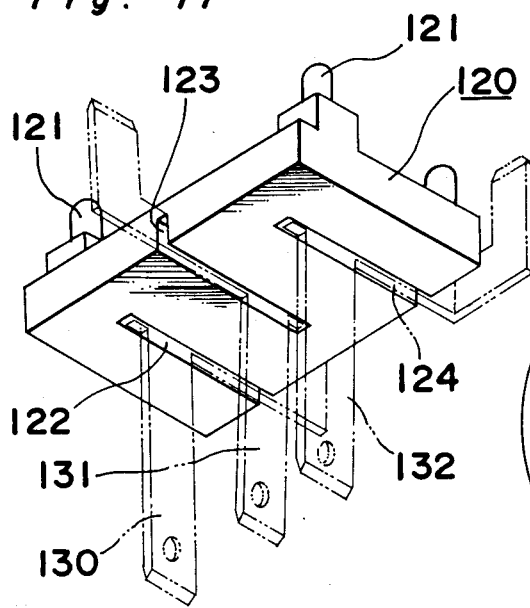
FIG. 11 is a perspective view of an essential portion, on an enlarged scale, of the electromagnetic relay of FIG. 8.
Figure 10:
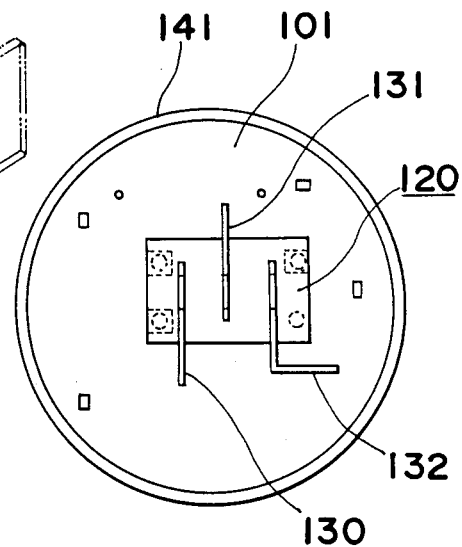
FIG. 10 is a bottom sectional view of the electromagnetic relay of FIG. 8.

Into guide grooves 122, 123 and 124 of the terminal guide block 120 are pressed base portions of leading terminals 130, 131 and 132 so as to be maintained thereby (referring to FIG. 11). Further, a projection 121 of the terminal guide block 120 is pressed into the mounting substrate 101 from below so as to be fixed to the substrate 101 (referring to FIGS. 8 and 9). Upper ends of the leading terminals 130, 131 and 132 are soldered to the printed circuit board (not shown) and electrically connected to the relay 110.

It is to be noted here, however, that an electric component to be mounted on the substrate 101 is not restricted to the relay 110, but may be a resistance or a capacitor. Moreover, it is also to be noted here that the leading terminals 130, 131 and 132 may be integrally formed with the terminal guide block 120 through insert-molding. In addition, the terminal guide block 120 may be fixed to the mounting substrate 101 into one unit by an adhesive material.

Next, the operation of the relay according to the fourth embodiment of the present invention will be described hereinbelow.

First, when no magnetization is effected, the tip end 115a of the movable iron piece 115 is moved into contact with the reverse surface of the ceiling of the head covering 141 by spring force of the movable contact piece 116. Simultaneously, the movable contact 116a is separated from the fixed contact 117a.

Then, when the coil 113 is excited, the movable iron piece 115 is attracted and contacted to the upper end surface of the iron core 114 against the spring force of the movable contact piece 116, thereby making a sound. At the same time, the movable contact 116a of the movable contact piece 116 is brought into contact with the fixed contact 117a, so that the circuit is closed (FIG. 9).

Finally, when the excitation is released, the spring force of the movable contact piece 116 separates the movable iron piece 115 from the upper end surface of the iron core 114. In accordance with this, the movable contact 116a is separated from the fixed contact 117a and at the same time, the end portion 115a of the movable iron piece 115 is brought into contact against the reverse face of the ceiling of the head covering 141 to generate a collision sound.

By repeating the above-described sequence of operations, the winker relay according to the instant embodiment intermittently generates a sound, which sound can be recognized by the driver as the actual operating sound of the winker relay, and therefore the winker relay is quite convenient and safe to handle.

Although the relay is described, in the fourth embodiment, with respect to the case where it is installed in the winker relay for a motor vehicle, the relay is not limited to this, but may be applicable to other types of relays or other electric appliances.

As is clear from the foregoing embodiments, when the relay of the present invention is employed, for example, into a conventional flasher relay, at least the movable part of the relay is exposed outside so that the movable part hits the inner wall of the housing directly when the electromagnet is de-magnetized or excited.

Furthermore, in a modified embodiment of the relay of the present invention, namely, for example, in a flasher relay wherein the relay itself which opens or closes contacts, through repetition of turning on and off of generation of outputs so that the electromagnetic device is excited and de-magnetized to attract and separate the movable part is accommodated with the housing, the spool of the electromagnetic device may be provided with a sounding member at the outside of the movable part, which sounding member is arranged to be hit by the movable part.

Likewise, in a flasher relay wherein the relay itself which opens or closes, through repetition of turning on and off of generation of outputs so that the electromagnetic device is excited and de-magnetized to attract and separate the movable part while the power is supplied, it may be possible that a sounding member is exposingly placed in the housing so that the sounding member is hit by the movable part. If the flasher relay of this type is mounted in automobiles, autobicycles, or the like, and the driver turns on the switch for the winker of the automobile, the flasher relay turns the winker lamp on and off, with making a sound. Accordingly, the driver can confirm the turning on and off of the winker lamp.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An electromagnetic relay, comprising:
   a base;
   a yoke having a horizontal piece which extends substantially parallel to said base, and at least three leg portions which extend essentially perpendicularly from said horizontal piece and are fixed to said base to form a generally triangular shape; and
   an electromagnetic block mounted on top of said yoke and a contact which is selectively opened and closed by operation of said block;
   wherein said base is a printed circuit board and electronic components mounted on said printed circuit board are placed in the space below the electromagnetic block constituted by said three leg portions.

2. An electromagnetic relay as in claim 1, further comprising a leading terminal of an electric device, wherein said leading terminal is electrically connected to an electric component mounted on a substrate of the electric device, and wherein a base portion of said leading terminal being supported by a terminal guide block secured to said substrate.

* * * * *